US012333986B2

(12) United States Patent
Wu

(10) Patent No.: US 12,333,986 B2
(45) Date of Patent: Jun. 17, 2025

(54) DISPLAY PANELS AND DISPLAY DEVICES

(71) Applicant: WUHAN CHINA STAR OPTOELECTRONICS SEMICONDUCTOR DISPLAY TECHNOLOGY CO., LTD., Hubei (CN)

(72) Inventor: Lei Wu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 6 days.

(21) Appl. No.: 18/540,658

(22) Filed: Dec. 14, 2023

(65) Prior Publication Data

US 2025/0037633 A1   Jan. 30, 2025

Related U.S. Application Data

(63) Continuation of application No. PCT/CN2023/114126, filed on Aug. 21, 2023.

(30) Foreign Application Priority Data

Jul. 26, 2023   (CN) .......................... 202310936519.X

(51) Int. Cl.
   *G09G 3/20*   (2006.01)
   *G09G 3/32*   (2016.01)
   *G11C 19/28*  (2006.01)

(52) U.S. Cl.
   CPC ............. *G09G 3/2007* (2013.01); *G09G 3/32* (2013.01); *G11C 19/287* (2013.01);
   (Continued)

(58) Field of Classification Search
   CPC ............... G09G 3/2007; G09G 3/32; G09G 2310/0286; G09G 2320/0233; G09G 2320/0247; G09G 2330/021; G11C 19/287
   See application file for complete search history.

(56) References Cited

U.S. PATENT DOCUMENTS 7,133,010 B2 * 11/2006 Kim ..................... G09G 3/3241
                                                       315/169.3
11,423,849 B2 * 8/2022 Huang ................. G09G 3/3291
(Continued)

FOREIGN PATENT DOCUMENTS

CN    1431643 A    7/2003
CN    1432985 A    7/2003
(Continued)

OTHER PUBLICATIONS

International Search Report in International application No. PCT/CN2023/114126, mailed on Feb. 1, 2024.
(Continued)

*Primary Examiner* — Amit Chatly
(74) *Attorney, Agent, or Firm* — PV IP PC; Wei Te Chung

(57) ABSTRACT

The present disclosure discloses a display panel and a display device. The display panel includes a pixel circuit. The pixel circuit includes a mirror current receiving module, a digital driving module, and a light-emitting module. The mirror current receiving module includes N mirror current receiving units. A control terminal of each N mirror current receiving unit is connected to one mirror current, and the N mirror current receiving units are respectively connected in series to light-emitting subloops. N is an integer greater than or equal to 2. The digital driving module includes N digital driving units respectively connected in series to the light-
(Continued)

emitting subloops. The light-emitting module is connected to a light-emitting loop formed by the light-emitting subloops.

18 Claims, 6 Drawing Sheets

(52) U.S. Cl.
CPC ............... *G09G 2310/0286* (2013.01); *G09G 2320/0233* (2013.01); *G09G 2320/0247* (2013.01); *G09G 2330/021* (2013.01)

(56) References Cited

U.S. PATENT DOCUMENTS

| | | | | |
|---|---|---|---|---|
| 2019/0114987 A1* | 4/2019 | Li | ........................ | G09G 3/3233 |
| 2021/0090493 A1* | 3/2021 | Hudson | ................ | G09G 3/3241 |
| 2024/0221629 A1* | 7/2024 | Li | ........................... | G09G 3/32 |

FOREIGN PATENT DOCUMENTS

| | | |
|---|---|---|
| CN | 1479271 A | 3/2004 |
| CN | 1530915 A | 9/2004 |
| CN | 1577454 A | 2/2005 |
| CN | 1949344 A | 4/2007 |
| CN | 101000745 A | 7/2007 |
| CN | 113327542 A | 8/2021 |
| JP | 2002118458 A | 4/2002 |
| KR | 20080002398 A | 1/2008 |

OTHER PUBLICATIONS

Written Opinion of the International Search Authority in International application No. PCT/CN2023/114126, mailed on Feb. 1, 2024.

* cited by examiner

DISPLAY PANELS AND DISPLAY DEVICES

CROSS-REFERENCE TO RELATED APPLICATION

This application is a continuation of International Application No. PCT/CN2023/114126, filed on Aug. 21, 2023, which claims priority to and the benefit of Chinese Patent Application No. 202310936519.X, filed on Jul. 26, 2023. The disclosures of the aforementioned applications are incorporated herein by reference in their entireties, only if specifically required.

TECHNICAL FIELD

The present disclosure relates to the field of display technologies, and in particular, to display panels and display devices.

BACKGROUND

In a display panel, grayscales of a pixel circuit mainly include an analog driving mode and a digital driving mode.

In the analog driving mode, light-emitting luminance of a light-emitting device is adjusted by adjusting a light-emitting current flowing through the light-emitting device. Each grayscale in the analog driving mode corresponds to one data voltage, and one data voltage corresponds to one light-emitting luminance of the light-emitting device.

In the digital driving mode, the light-emitting luminance of a light-emitting device is adjusted by adjusting a light-emitting time of the light-emitting device. An operating status of the light-emitting device in the digital driving mode only includes a bright state and a dark state.

However, to implement a same grayscale display, the digital driving mode requires more subframes, which requires a larger amount of display data.

SUMMARY

According to a first aspect, the present disclosure provides a display panel. The display panel includes a plurality of pixel circuits. A pixel circuit includes a mirror current receiving module, a digital driving module, and a light-emitting module. The mirror current receiving module includes N mirror current receiving units, a control terminal of each of the N mirror current receiving units is connected to one mirror current, and the N mirror current receiving units are respectively connected in series to light-emitting subloops, N being an integer greater than or equal to 2. The digital driving module includes N digital driving units, and the N digital driving units are respectively connected in series to the light-emitting subloops. The light-emitting module is connected to a light-emitting loop formed by the light-emitting subloops.

According to a second aspect, the present disclosure provides a display device. The display device includes a terminal main body and the display panel according to at least one of the foregoing implementations disposed on the terminal main body.

DETAILED DESCRIPTION OF EMBODIMENTS

To make the objectives, technical solutions, and effect of the present disclosure clearer, the following further describes the present disclosure in detail with reference to the accompanying drawings and the embodiments. It should be understood that the specific embodiments described herein are merely used to explain the present disclosure but are not intended to limit the present disclosure.

Referring to FIGS. 1 to 8, generally, grayscales of a light-emitting system mainly include an analog driving mode and a digital driving mode.

In analog driving, light-emitting luminance of a light-emitting module 101 is adjusted by adjusting a driving current flowing through the light-emitting module 101. Each grayscale in analog driving corresponds to one data voltage, and one data voltage corresponds to one light-emitting luminance of the light-emitting module 101.

In digital driving, the light-emitting luminance of a light-emitting module 101 is adjusted by adjusting a light-emitting time of the light-emitting module 101. An operating status of the light-emitting module 101 in digital driving only includes a bright state and a dark state. The operating timing of digital driving includes "1" state time sequence and "0" state time sequence. "1" state corresponds to the bright state of the light-emitting module 101, and "0" state corresponds to the dark state of the light-emitting module 101. In digital driving, grayscales are controlled by controlling a length of the light-emitting time (that is, duration of the bright state and duration of the dark state) of the light-emitting module 101.

In an analog driving solution, a light-emitting wavelength changes according to a magnitude of a driving current (a light-emitting current). When micro light-emitting diodes (Micro-LEDs) are driven by a small current, the Micro-LEDs have large differences in light-emitting luminance, causing severely nonuniform display. This phenomenon is severer in a display panel 100 with a micro size. Therefore, a digital driving solution is usually used to drive the Micro-LEDs at present, to avoid the foregoing display problem.

In the digital driving, a subfield scanning method is usually used to implement grayscale display. That is, a scan time of each frame of a display picture is divided into subfields with different sizes, and light-emitting control is performed on each subfield. A total light-emitting time in the each frame may be controlled through a combination of the subfields, to control a lighting time of each display unit in the display panel 100, and achieve a display effect that the display units have different grayscales.

Figure 1:
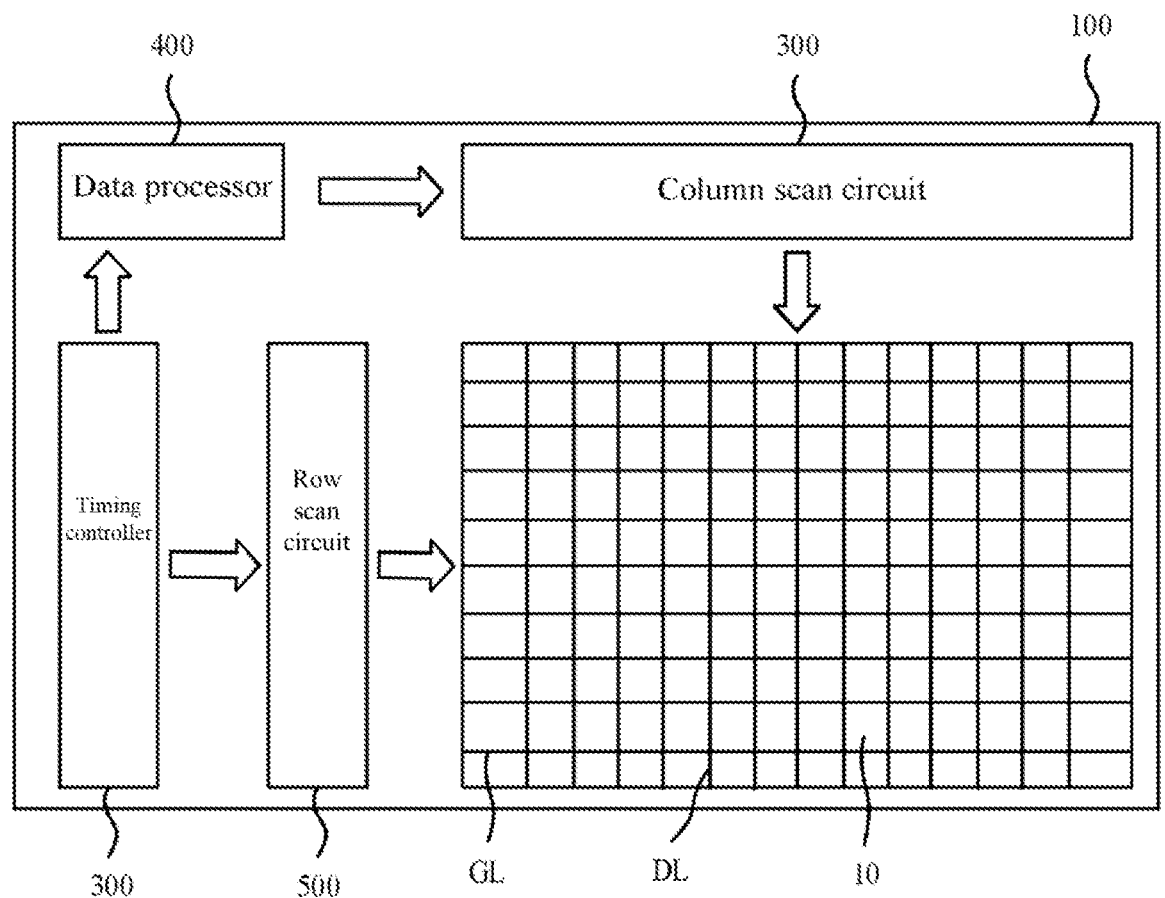
FIG. 1 is a structural block diagram of a display panel in the related art.

At present, for monochromatic array display driving, the display panel 100 shown in FIG. 1 is usually used. The display panel 100 includes a timing controller 300, a data processor 400, a column scan circuit 300, and a row scan circuit 500. The column scan circuit 300 is connected to data lines DL, the row scan circuit 500 is connected to scan lines GL, and pixel circuits 10 are disposed in cross regions formed by the data lines DL and the scan lines GL.

Figure 2:
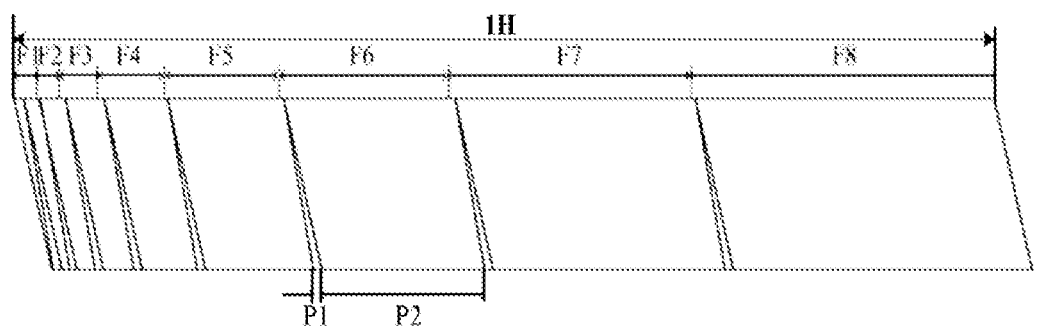
FIG. 2 is a schematic diagram of a subfield division in the related art.
Figure 3:
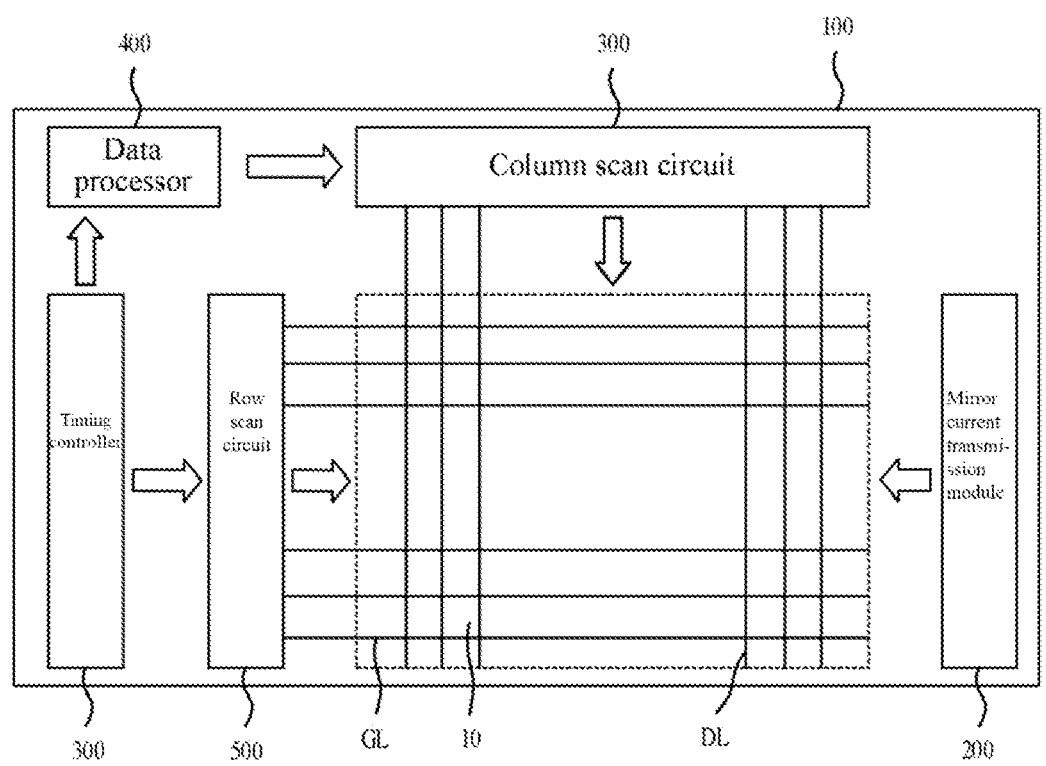
FIG. 3 is a schematic structural diagram of a display panel according to some embodiments of the present disclosure.

In the foregoing monochromatic array display driving, the subfield scanning method in the digital driving is often used. As shown in FIG. 2, one frame (1H) includes a plurality of subframes, the subframes have different weighting values, and each subframe includes a data write phase P1 and a light-emitting phase P2. That the subframes have different weighting values means that the light-emitting phases P2 in the subframes have different duration, that is, the light-emitting module 101 has different lighting duration. A manner of setting the weighting value may include a standard binary weighting value increase or a nonstandard binary weighting value increase. For example, a frame in FIG. 2 includes eight subframes, i.e., a subframe F1, a subframe F2, a subframe F3, a subframe F4, a subframe F5, a subframe F6, a subframe F7, and a subframe F8. When the manner of standard binary weighting value increase is used, a ratio of weighting value of the subframes is $1 (2^0): 2(2^1): 4(2^2): 8(2^3): 16(2^4): 32 (2^5): 64(2^6): 128(2^7)$. Display data of a frame is a superimposition of grayscales of the subframes, thereby realizing 256 grayscale display. To improve light-emitting luminance of a grayscale L255 of display units, during a scan of each row of display units by a scan signal, each row of display units immediately emit light after an addressing scan time, and each display unit may continuously emit light within a driving time of an entire frame of the display picture.

However, in the pure digital driving solution shown FIG. 2, a high grayscale subfield lasts for an excessively long time, resulting in nonuniform subfield division, which tends to cause a perception of flickering. To mitigate such a flickering phenomenon, at present, a common method is to divide original eight subfields with different duration into 19 subframes with equal duration, and then in the 19 subframes in one frame, scan and read of data in different bit planes are performed 19 times. In this way, the flickering phenomenon that can be clearly perceived by human eyes is mitigated. In this case, a large amount of data needs to transmitted for each subframe.

In addition, as requirements of a resolution, a refresh rate, and display grayscale improve, even in monochromatic display, the requirements for a clock frequency in the digital subfield scan method has reached a peak level. Based on this solution, the implementation corresponding to 256 grayscales has become very difficult, the grayscale needs to be increased to 1024 to implement 8-bit display that meets GAM2.2.

Further, to implement the same grayscale display, the digital driving further requires more subframes, which requires a larger amount of display data.

In view of the above, the present disclosure provides a display panel 100. Compared to the display panel 100 shown in FIG. 1, a mirror current transmission module 200 is provided to the display panel 100 shown in FIG. 3. The mirror current transmission module 200 may precisely provide a light-emitting current to a corresponding pixel circuit 10 through a mirror function, so that light-emitting luminance of a light-emitting module 101 can be controlled more precisely.

It needs to be noted that, an external application processor sends an image signal to the timing controller 300. The timing controller 300 separates a corresponding data signal and a corresponding timing signal from the image signal. The data signal is sequentially processed by the data processor 400 and the column scan circuit 300 and is then written into the corresponding pixel circuit 10 through a data lines DL. The timing signal controls a row scan circuit 500 to output a corresponding scan signal through a scan line GL, to implement addressing scan of the pixel circuit 10.

Figure 4:
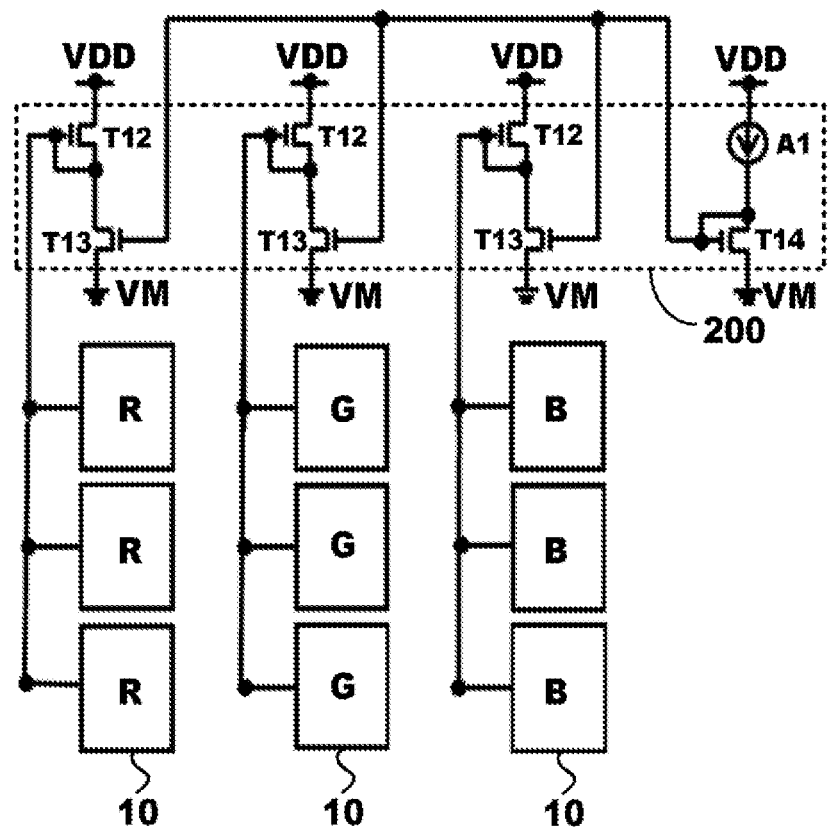
FIG. 4 is a schematic diagram of a structure of a display panel according to some embodiments of the present disclosure.
Figure 5:
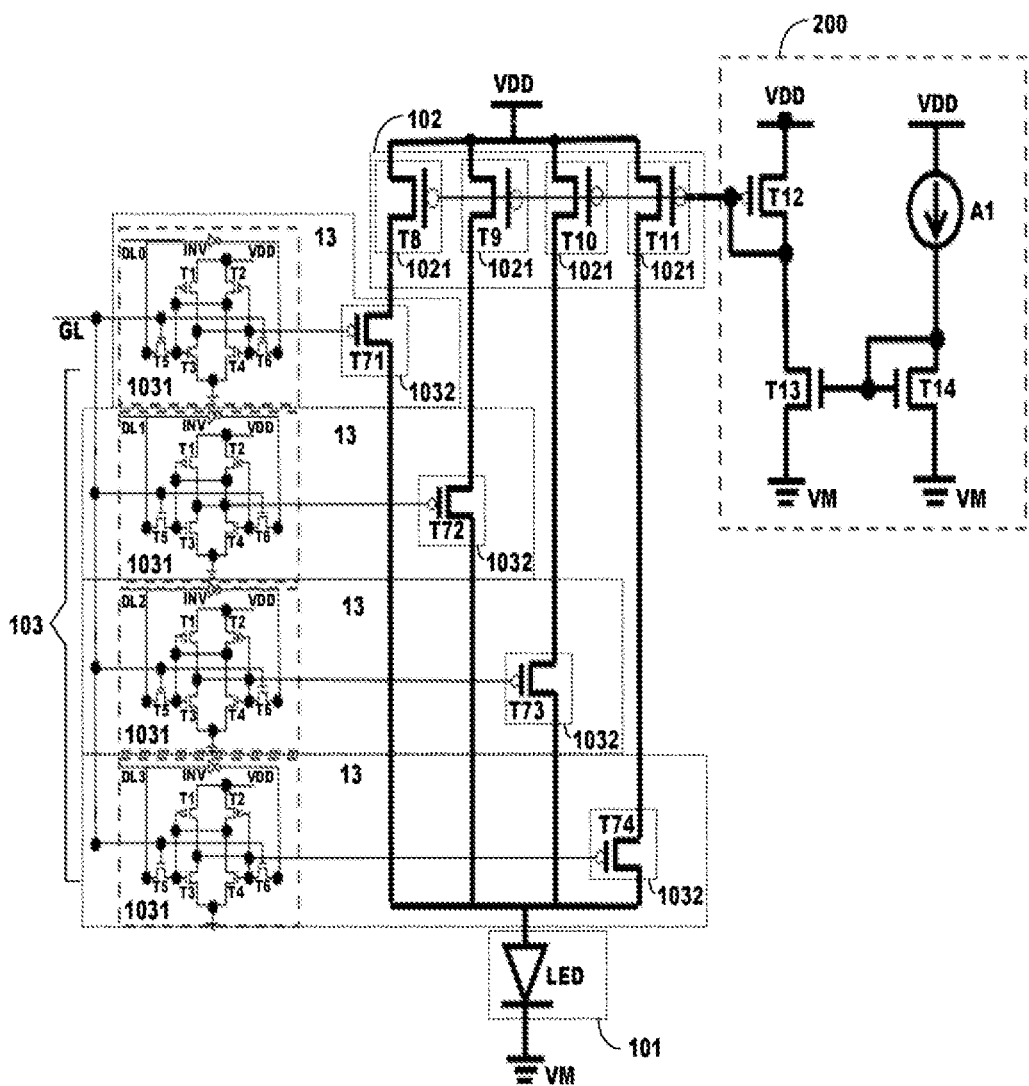
FIG. 5 is a schematic diagram another structure of a display panel according to some embodiments of the present disclosure.
Figure 6:
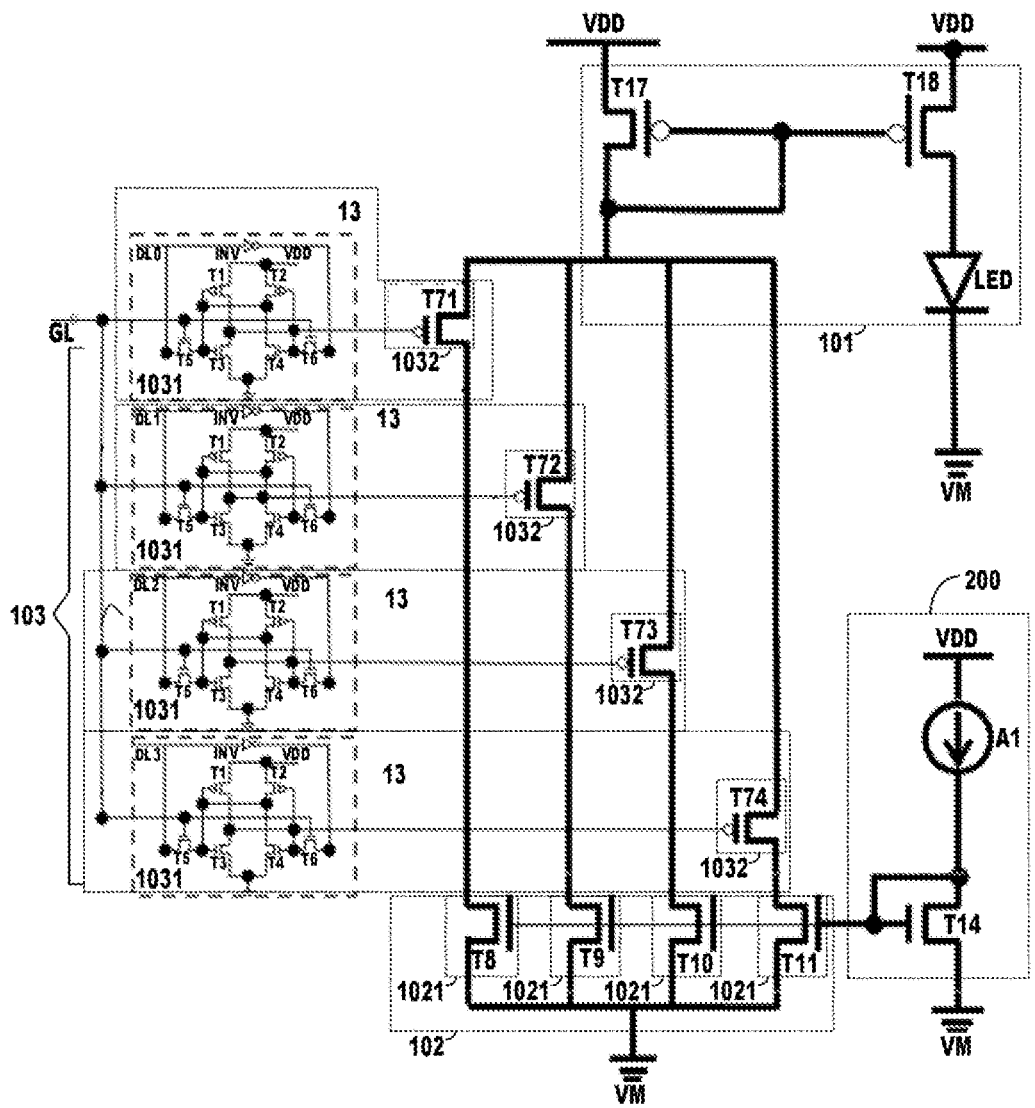
FIG. 6 is a schematic diagram of still another structure of a display panel according to some embodiments of the present disclosure.

In some embodiments, as shown in FIGS. 4, 5, and 6, the mirror current transmission module 200 that provides a mirror current is connected to a mirror current receiving module 102 in each pixel circuit 10, to enable the mirror current receiving module 102 to receive the mirror current.

It may be understood that, light-emitting currents flowing through a plurality of mirror current receiving units 1021 are controlled through one mirror current, which reduces a quantity of mirror current transmission modules 200, improves control precision of a light-emitting current, and improves control precision of light-emitting luminance of the light-emitting module 101.

Further, by controlling the light-emitting currents flowing through the plurality of mirror current receiving units 1021 through the one mirror current, the light-emitting current may be controlled to change in a stepped manner (compared to a light-emitting current in an analog driving mode that continuously changes), so that drifts of a light-emitting wavelength of the light-emitting module 101 can be effectively mitigated.

That is, the light-emitting current controlled through the mirror current changes in a stepped manner, rather than changing continuously as an analog value.

In some embodiments, as shown in FIG. 4, a column of pixel circuits 10 with a same display color are connected to one mirror current, and columns of pixel circuits 10 with different display colors are connected to different mirror currents.

It needs to be noted that, a quantity of combinations, each of which is formed by a fourth mirror transistor T13 and a fifth mirror transistor T12, may be same as a quantity of columns of the pixel circuits 10 in and the display panel 100; and/or a quantity of combinations, each of which is formed by a fourth mirror transistor T13 and a fifth mirror transistor T12, may be same as a quantity of color types that can be displayed by the pixel circuit 10. For example, if the pixel circuit 10 may display red (R), green (G), and blue (B), the quantity of combinations, each of which is formed by the fourth mirror transistor T13 and the fifth mirror transistor T12, is 3, to implement a connection between one of the combinations and a pixel circuit 10 of one display color.

In some embodiments, the fourth mirror transistors T13 and the fifth mirror transistors T12 respectively connected to the pixel circuits 10 for displaying red (R), green (G), and blue (B) may have different channel width-to-length ratios, to facilitate respective adjustment of luminance of the pixel circuits 10 for different colors and/or in different columns. In some other embodiments, the fourth mirror transistors T13 and the fifth mirror transistors T12 respectively connected to the pixel circuits 10 for displaying red (R), green (G), and blue (B) may have a same channel width-to-length ratio, to reduce quantities of the fourth mirror transistors T13 and the fifth mirror transistors T12.

In this way, a quantity of the foregoing combinations can be reduced, and a luminance difference between the pixel circuits 10 for different colors and/or in different columns can be further reduced to improve luminance uniformity of the display panel 100.

A first electrode may be one of a source or a drain, and a second electrode may be the other one of a source or a drain. For example, in a case that the first electrode is a source, the second electrode is a drain; or, in a case that the first electrode is a drain, the second electrode is a source.

In some embodiments, as shown in FIG. 6, the mirror current transmission module 200 further includes a current source A1 and a third mirror transistor T14, and one terminal of the current source A1 is connected to a power supply positive terminal VDD. A first electrode of the third mirror transistor T14 is connected to another terminal of the current source A1 and a gate of the third mirror transistor T14 to provide the mirror current, and a second electrode of the third mirror transistor T14 is connected to a power supply negative terminal VM.

It needs to be noted that, in some other embodiments, the current source A1 may be connected in series between the third mirror transistor T14 and the power supply negative terminal VM, which may achieve expected functions.

The current source A1 may include a controlled current source. A corresponding register is added to the display panel 100 or the mirror current transmission module 200, to control a magnitude of a current of the current source A1, so as to improve a response speed and sensitivity of control.

In some embodiments, as shown in FIGS. 4 and 5, the mirror current transmission module 200 includes the current source A1, the third mirror transistor T14, a fourth mirror transistor T13, and a fifth mirror transistor T12. One terminal of the current source A1 is connected to the power supply positive terminal VDD. The first electrode of the third mirror transistor T14 is connected to the other terminal of the current source A1 and the gate of the third mirror transistor T14, and the second electrode of the third mirror transistor T14 is connected to the power supply negative terminal VM. A gate of the fourth mirror transistor T13 is connected to the gate of the third mirror transistor T14, and a first electrode of the fourth mirror transistor T13 is connected to the power supply negative terminal VM. A first electrode of the fifth mirror transistor T12 is connected to the power supply positive terminal VDD, and a second electrode of the fifth mirror transistor T12 is connected to a second electrode of the fourth mirror transistor T13 and a gate of the fifth mirror transistor T12 to provide the mirror current.

It needs to be noted that, the fourth mirror transistor T13 and the fifth mirror transistor T12 are added to the mirror current transmission module 200, so that a magnitude of a light-emitting current can be changed by adjusting channel width-to-length ratios of the fourth mirror transistor T13 or the fifth mirror transistor T12. In this way, there are more methods for adjusting the light-emitting current.

In some embodiments, the display panel 100 includes a plurality of pixel circuits 10. Each pixel circuit 10 includes a mirror current receiving module 102, a digital driving module 103, and a light-emitting module 101. The mirror current receiving module 102 includes N mirror current receiving units 1021. A control terminal of each mirror current receiving unit 1021 is connected to one mirror current. The N mirror current receiving units 1021 are respectively connected in series to light-emitting subloops, and N is an integer greater than or equal to 2. The digital driving module 103 includes N digital driving units 13, and the N digital driving units 13 are respectively connected in series to the light-emitting subloops. The light-emitting module 101 is connected to a light-emitting loop formed by light-emitting subloops.

It may be understood that, in the display panel 100 provided in the present embodiments, the mirror current receiving unit 1021 adjusts a light-emitting current in the corresponding light-emitting subloop, and the digital driving unit 13 adjusts a light-emitting time of the light-emitting module 101 through the corresponding light-emitting subloop, achieving a hybrid driving mode. Compared with a single digital driving mode, in a same grayscale display, the hybrid driving mode may require fewer subframes, and a transmission amount of display data can be further reduced.

Compared to low light-emitting efficiency due to an excessively small light-emitting current at a low grayscale in the single analog driving, in the present embodiments, the light-emitting current may further be increased by reducing a light-emitting time, to improve the light-emitting efficiency.

In some embodiments, as shown in FIGS. 5 and 6, the mirror current receiving unit 1021 includes a plurality of receiving transistors, a gate of each receiving transistor is connected to a mirror current, and each receiving transistor is connected in series to one of the light-emitting subloops. Receiving transistors in one pixel circuit 10 have different channel width-to-length ratios.

It needs to be noted that, the receiving transistors may operate in a linear region. Compared with a saturated region, the receiving transistors consume lower power, so that power consumption can be further reduced.

Magnitudes of the light-emitting currents flowing through the receiving transistors can be adjusted through channel width-to-length ratios of the receiving transistors, so that different light-emitting currents provided by receiving transistors in a same pixel circuit 10 are combined into more grayscale display.

In some embodiments, as shown in FIGS. 5 and 6, the digital driving unit 13 includes a switching transistor 1032 and a register 1031. The switching transistor 1032 is connected in series to one of the light-emitting subloops. The register 1031 is connected to a gate of the switching transistor 1032, a scan line GL, and a data line DL.

It needs to be noted that, the register 1031 is configured to store a digital signal (a data signal) sent by the application processor. The digital signal (i.e., 0/1) controls, through the switching transistor 1032, whether the light-emitting module 101 emits light. The register 1031 may store data permanently. The stored data does not disappear as long as the pixel circuit 10 is not powered off, and it is not necessary to dynamically refresh the data.

In a case that the switching transistor 1032 is a P channel transistor, 0 represents emitting light, and 1 represents not emitting light. Alternatively, in a case that the switching transistor 1032 is an N channel transistor, 1 represents emitting light, and 0 represents not emitting light.

It needs to be noted that, a receiving transistor T8 and a switching transistor T71 may form a light-emitting subloop. A receiving transistor T9 and a switching transistor T72 may form another light-emitting subloop. A receiving transistor T10 and a switching transistor T73 may form another light-emitting subloop. A receiving transistor T11 and a switching transistor T74 may form another light-emitting subloop. The light-emitting subloops are connected in parallel to form a light-emitting loop.

To display different quantities of grayscales, a quantity of light-emitting subloops may be correspondingly adjusted, for example, may be 1, 2, 3, 4 or a larger integer.

The switching transistor 1032 may operate in a linear region. Compared with a saturated region, the receiving transistors consume lower power, so that power consumption can be further reduced.

In some embodiments, as shown in FIGS. 5 and 6, the register 1031 includes a phase inverter INV, a first storage transistor T1, a second storage transistor T3, a third storage transistor T2, a fourth storage transistor T4, a fifth storage transistor T5, and a sixth storage transistor T6. An input terminal of the phase inverter INV is connected to the data line DL. A first electrode of the first storage transistor T1 is connected to a power supply positive terminal VDD. A first electrode of the second storage transistor T3 is connected to a second electrode of the first storage transistor T1 and the gate of the switching transistor 1032, a second electrode of the second storage transistor T3 is connected to a power supply negative terminal VM, and a gate of the second storage transistor T3 is connected to a gate of the first storage transistor T1. A first electrode of the third storage transistor T2 is connected to the power supply positive terminal VDD, a second electrode of the third storage transistor T2 is connected to the gate of the first storage transistor T1, and a gate of the third storage transistor T2 is connected to the second electrode of the first storage transistor T1. A first electrode of the fourth storage transistor T4 is connected to the second electrode of the third storage transistor T2, a second electrode of the fourth storage transistor T4 is connected to the power supply negative terminal VM, and a gate of the fourth storage transistor T4 is connected to the gate of the third storage transistor T2. A first electrode of the fifth storage transistor T5 is connected to the data line DL, a second electrode of the fifth storage transistor T5 is connected to the gate of the second storage transistor T3, and a gate of the fifth storage transistor T5 is connected to the scan line GL. A first electrode of the sixth storage transistor T6 is connected to an output terminal of the phase inverter INV, a second electrode of the sixth storage transistor T6 is connected to the gate of the third storage transistor T2, and a gate of the sixth storage transistor T6 is connected to the gate of the fifth storage transistor T5.

It needs to be noted that, in some embodiments, when the register 1031 is connected to a logic 0 through the data lines DL, the register 1031 may output a corresponding logic 1. In some other embodiments, the register 1031 may output a corresponding logic 0 when the register is connected to the logic 0. Alternatively, the register 1031 may output corresponding logic 1 when the register is connected to a logic 1.

Specifically, in a case that the data line DL0/DL1/DL2/DL3 transmits the logic 0, the scan lines GL provide a high potential to turn on the fifth storage transistor T5 and the sixth storage transistor T6, the logic 0 turns on the first storage transistor T1 and turns off the second storage transistor T3, and the first storage transistor T1 outputs the logic 1. Synchronously, the logic 0 is converted into the logic 1 through the phase inverter INV, the logic 1 turns off the third storage transistor T2 and turns on the fourth storage transistor T4 through the sixth storage transistor T6, and the fourth storage transistor T4 outputs the logic 0. Since the first storage transistor T1 and the sixth storage transistor T6 both output the logic 1, the register 1031 outputs logic 1. It may be understood that, in contrast, in a case that the data line DL0/DL1/DL2/DL3 transmits the logic 1, the register 1031 outputs the logic 0.

In some embodiments, as shown in FIGS. 5 and 6, registers 1031 in one digital driving module 103 are connected to one scan line GL, and registers 1031 in one digital driving module 103 are respectively connected to different data lines DL.

It needs to be noted that, in the present embodiments, a corresponding logic value may be synchronously written into the registers 1031 in one digital driving module 103 and a corresponding logic value may be outputted from the registers 1031 in one digital driving module 103, and different the data lines DL may flexibly configure a combination of logic values outputted by the register 1031. Further, compared with a case in which one pixel circuit 10 requires a plurality of scan lines GL, the present embodiments may further reduce a quantity of scan lines GL.

In some embodiments, as shown in FIG. 5, the light-emitting module 101 includes a light-emitting device LED, and the light-emitting device LED is connected to the light-emitting loop.

It needs to be noted that, a light-emitting current in the light-emitting loop is determined by a combination of channel width-to-length ratios of the receiving transistors and switching states of the switching transistor 1032. In a case that there are four light-emitting subloops, the light-emitting module 101 may implement display of 256 different grayscales.

The light-emitting device LED may be an organic light-emitting diode (OLED), a Micro-LED, a mini LED, or a quantum dot LED. In some embodiments, the light-emitting device LED is a Micro-LED.

In some embodiments, as shown in FIG. 6, the light-emitting module 101 further includes a first mirror transistor T17 and a second mirror transistor T18. A first electrode of the first mirror transistor T17 is connected to a power supply positive terminal VDD, and a gate of the first mirror transistor T17 is connected to a second electrode of the first mirror transistor T17 and the light-emitting subloops. A gate of the second mirror transistor T18 is connected to the gate of the first mirror transistor T17, a first electrode of the second mirror transistor T18 is connected to the power supply positive terminal VDD, a second electrode of the second mirror transistor T18 is connected to an anode of the light-emitting device LED, and a cathode of the light-emitting device LED is connected to a power supply negative terminal VM.

It needs to be noted that, compared to the light-emitting module 101 shown in FIG. 5, the first mirror transistor T17 and the second mirror transistor T18 are added to the embodiments shown in FIG. 6. The first mirror transistor T17 and the second mirror transistor T18 may form a mirror current circuit. In this case, light-emitting currents flowing through the light-emitting subloops may be reduced to increase a channel width-to-length ratio of the second mirror transistor T18 to increase a light-emitting current flowing through the light-emitting loop, so as to reduce the power consumption of the pixel circuit 10.

As can be seen based on the foregoing analysis, assuming that a current provided by the current source A1 is Iref, all the light-emitting currents of the pixel circuits 10 in the display panel 100 are Iref of a corresponding proportion (a correspondence relationship of a specific proportion may be referred to the following description about FIGS. 5 and 6). In this way, the light-emitting luminance of the pixel circuit 10 is highly consistent, to improve luminance uniformity of the display panel 100.

In FIG. 5, the third mirror transistor T14 and the fourth mirror transistor T13 form a first-stage mirror current circuit, and the fifth mirror transistor T12 and the receiving transistors form a second-stage mirror transistor, and a current flowing through the fourth mirror transistor T13 is equal to a current flowing through the fifth mirror transistor T12.

Therefore, the current flowing through the fourth mirror transistor T13 or the current flowing through the fifth mirror transistor T12 is K1*Iref. K1=(W13/L13)/(W14/L14). W13 and L13 are respectively a width and a length of a channel of the fourth mirror transistor T13, and W14 and L14 are respectively a width and a length of a channel of the third mirror transistor T14.

The channel width-to-length ratios of the receiving transistor T8, the receiving transistor T9, the receiving transistor T10, and the receiving transistor T11 are adjusted, so that currents flowing through the receiving transistor T8, the receiving transistor T9, the receiving transistor T10, and the receiving transistor T11 are respectively 1*K1*K2*Iref, 2*K1*K2*Iref, 4*K1*K2*Iref, and 8*K1*K2*Iref in sequence. K2 is a ratio of the channel width-to-length ratio of each receiving transistor to a channel width-to-length ratio of the fifth mirror transistor T12.

In this case, a ratio of the light-emitting currents flowing through the receiving transistor T8, the receiving transistor T9, the receiving transistor T10, and the receiving transistor T11 is 1:2:4:8. In a case that the four registers 1031 receive different logic values, there are a total of 16 different light-emitting currents flowing through the light-emitting module 101.

In the pixel circuit 10 shown in FIG. 6, the first mirror transistor T17 and the second mirror transistor T18 may form a mirror current circuit. In this case, the channel width-to-length ratios of the receiving transistor T8, the receiving transistor T9, the receiving transistor T10, and the receiving transistor T11 are adjusted, so that the currents flowing through the receiving transistor T8, the receiving transistor T9, the receiving transistor T10, and the receiving transistor T11 are respectively 1*J1*Iref, 2*J1*Iref, 4*J1*Iref, and 8*J1*Iref in sequence. J1 is a ratio of the channel width-to-length ratio of each receiving transistor to a channel width-to-length ratio of the third mirror transistor T14.

A current flowing through the first mirror transistor T17 is 15*J1*Iref, and a current flowing through the second mirror transistor T18 is 15*J1*J2*Iref. J2 is a ratio of a channel width-to-length ratio of the first mirror transistor T17 to the channel width-to-length ratio of the second mirror transistor T18.

In this way, a light-emitting current flowing through light-emitting device LED can be improved by reducing a light-emitting current flowing through the first mirror transistor T17 and increasing the channel width-to-length ratio of the second mirror transistor T18, so that the overall power consumption can be reduced.

Figure 7:
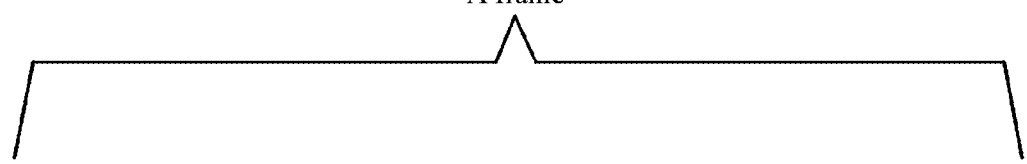
FIG. 7 is a schematic diagram of a time sequence of a pixel circuit according to some embodiments of the present disclosure.

FIG. 7 is a schematic diagram of a time sequence of a pixel circuit 10 according to some embodiments of the present disclosure. In the time sequence solution, a complete frame (for example, with duration of 8333 us) is divided into 16 subframes with duration same, that is, F1 to F16. A time of each subframe is 520 us. The first subframe F1 is an analog driving subframe (PAM), and the following 15 subframesF2 to F16 are digital driving frames (PWM). In a case that the grayscale increases from 0, a light-emitting current in the analog driving subframe increases accordingly, and four light-emitting subloops may be combined into 16 different levels of light-emitting currents. When the light-emitting current in the analog driving subframe reaches a maximum level, the pixel circuit 10 enters the second subframe F2 and the rest is deduced by analogy. The 16 different levels of the light-emitting currents can be implemented in all the 16 subframes. By combining the 16 different levels of the light-emitting currents, 256 different grayscales can be implemented.

It needs to be noted that, compared with the single digital driving that 19 subframes are required to implement 256 grayscales, in the present disclosure, 16 subframes are used to implement 256 grayscales, reducing a quantity of subframes and a transmission amount of data.

Figure 8:
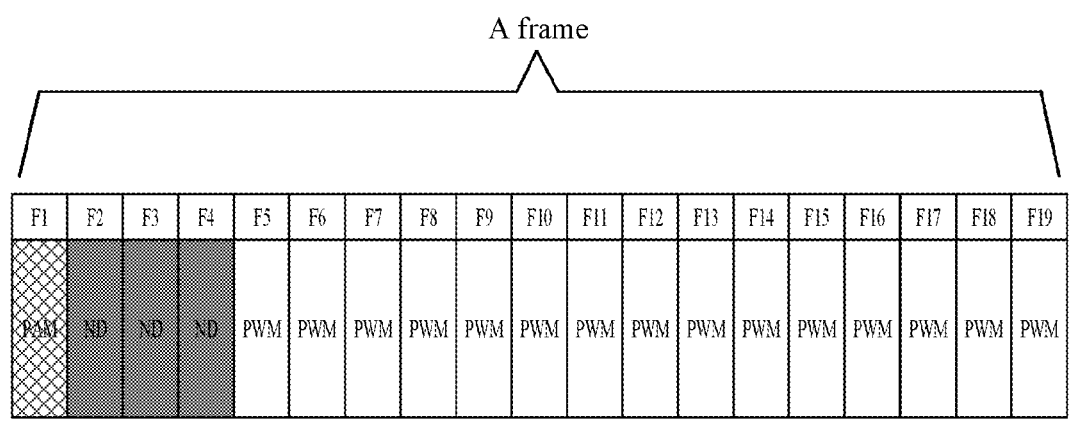
FIG. 8 is a schematic diagram of another time sequence of a pixel circuit according to some embodiments of the present disclosure.

FIG. 8 is a schematic diagram of another time sequence of a pixel circuit 10 according to some embodiments of the present disclosure. Compared with FIG. 7, in the time sequence solution, at least one black frame insertion driving subframe is inserted after the analog driving subframe of the frame. The at least one black frame insertion driving subframe may be inserted separately or together before or after different digital driving frames. Duration of each black frame insertion driving subframe is same as duration of the analog driving subframe.

It needs to be noted that, the black frame insertion driving subframe may implement the function equivalent to adjustment of a switching frequency of the switching transistor 1032, so that a flickering risk can be reduced. In the black frame insertion driving subframe, a corresponding light-emitting device LED displays a grayscale of 0.

In some embodiments, one frame of the pixel circuit 10 includes an analog driving subframe and a plurality of digital driving subframes, and duration of the analog driving subframe is same as duration of each digital driving subframe. The analog driving subframe is configured to adjust a light-emitting current flowing through the light-emitting module 101. The each digital driving subframe is configured to adjust a light-emitting time of the light-emitting module 101.

It needs to be noted that, in some embodiments, each foregoing transistor may be one of a P channel thin-film transistor or an N channel thin-film transistor. In another one of the embodiments, each foregoing transistor may be the other one of a P channel thin-film transistor or an N channel thin-film transistor. Two transistors in one mirror current circuit have a same channel type.

In some embodiments, as shown in FIGS. 7 and 8, in a frame, the analog driving subframe is located before all of the digital driving subframes.

It needs to be noted that, these embodiments are formulated based on a specific algorithm in the present disclosure, and cannot be changed at will. Detailed description of the algorithm is provided below.

To realize display of 256 grayscales, the digital driving module 103 includes four digital driving units 13. Each digital driving unit 13 includes a switching transistor 1032 and a register 1031. In the analog driving subframe, the register 1031 is connected to a bit value of a data signal, to control the switching transistor 1032 to be in an on state or an off state.

It needs to be noted that, as a part of the foregoing algorithm, four switching transistors 1032 may respectively control on or off of light-emitting subloops, and since channel width-to-length ratios of receiving transistors connected in series in the light-emitting subloops are different, when the light-emitting subloops are turned on, light-emitting currents flowing through the light-emitting subloops are different. In this way, the four registers 1031 control, according to four bit values connected thereto, the four switching transistors 1032 to be in an on state, thereby achieving 16 different light-emitting currents. For example, a combination of bit values transmitted by the data lines DL0/DL1/DL2/DL3 may be 0000-1111.

In some embodiments, in the digital driving subframes, the registers 1031 are respectively connected to a same bit value of one data signal, to control all the switching transistors 1032 to be in an on state or an off state.

It needs to be noted that, in these embodiments, as another part of the foregoing algorithm, in each digital driving subframe, all the registers 1031 are connected to a bit value of 0 or 1. In this case, all the switching transistors 1032 are in an on state or an off state.

Finally, through combinations of the light-emitting luminance and light-emitting time of one analog driving subframe and fifteen digital driving subframes, display of a corresponding grayscale in a frame is implemented.

In some embodiments, the present embodiment provides a display device. The display device includes a terminal main body and the display panel 100 according to at least one of the foregoing embodiments disposed on the terminal main body.

It may be understood that, since the display device provided in the present embodiment includes the display panel 100 in at least one foregoing embodiment, a mirror current receiving unit 1021 can also adjust a light-emitting current in a corresponding light-emitting subloop, and a digital driving unit 13 adjust a light-emitting time of a light-emitting module 101 through a corresponding light-emitting subloop, achieving a hybrid driving mode. Compared with a single digital driving mode, in a same grayscale display, the hybrid driving mode may require fewer subframes, and a transmission amount of display data can be further reduced.

It may be understood that, a person of ordinary skill in the art may make equivalent replacements or variations according to the technical solution of the present disclosure and the inventive idea thereof. All these changes or replacements shall fall within the scope of protection of the appended claims of the present disclosure.

What is claimed is:

1. A display panel, wherein the display panel comprises a plurality of pixel circuits, and each of the plurality of the pixel circuits comprises: a mirror current receiving module, wherein the mirror current receiving module comprises N mirror current receiving units, a control terminal of each of the N mirror current receiving units is connected to one mirror current, and the N mirror current receiving units are respectively connected in series to light-emitting subloops, N being an integer greater than or equal to 2; a digital driving module, wherein the digital driving module comprises N digital driving units, and the N digital driving units are respectively connected in series to the light-emitting subloops; a light-emitting module, wherein the light-emitting module is connected to a light-emitting loop formed by the light-emitting subloops; and wherein each of the N digital driving units comprises: a register and the register comprises: a phase inverter, wherein an input terminal of the phase inverter is connected to the data line; a first storage transistor, wherein a first electrode of the first storage transistor is connected to a power supply positive terminal; a second storage transistor, wherein a first electrode of the second storage transistor is connected to a second electrode of the first storage transistor and the gate of the switching transistor, a second electrode of the second storage transistor is connected to a power supply negative terminal, and a gate of the second storage transistor is connected to a gate of the first storage transistor; a third storage transistor, wherein a first electrode of the third storage transistor is connected to the power supply positive terminal, a second electrode of the third storage transistor is connected to the gate of the first storage transistor, and a gate of the third storage transistor is connected to the second electrode of the first storage transistor; a fourth storage transistor, wherein a first electrode of the fourth storage transistor is connected to the second electrode of the third storage transistor, a second electrode of the fourth storage transistor is connected to the power supply negative terminal, and a gate of the fourth storage transistor is connected to the gate of the third storage transistor; a fifth storage transistor, wherein a first electrode of the fifth storage transistor is connected to the data line, a second electrode of the fifth storage transistor is connected to the gate of the second storage transistor, and a gate of the fifth storage transistor is connected to the scan line; and a sixth storage transistor, wherein a first electrode of the sixth storage transistor is connected to an output terminal of the phase inverter, a second electrode of the sixth storage transistor is connected to the gate of the third storage transistor, and a gate of the sixth storage transistor is connected to the gate of the fifth storage transistor.

2. The display panel as claimed in claim 1, wherein the mirror current receiving unit comprises a plurality of receiving transistors, a gate of each of the plurality of receiving transistor is connected to the one mirror current, and the plurality of receiving transistors are respectively connected in series to the light-emitting subloops,
wherein the plurality of receiving transistors have different channel width-to-length ratios.

3. The display panel as claimed in claim 1, wherein each of the N digital driving units comprises: a switching transistor connected in series to one of the light-emitting subloops; and the register connected to a gate of the switching transistor, a scan line, and a data line.

4. The display panel as claimed in claim 3, wherein registers in the N digital driving units are connected to one scan line and are respectively connected to different data lines.

5. The display panel as claimed in claim 1, wherein the light-emitting module comprises a light-emitting device, connected to the light-emitting loop.

6. The display panel as claimed in claim 5, wherein the light-emitting module further comprises:
a first mirror transistor, wherein a first electrode of the first mirror transistor is connected to a power supply positive terminal, and a gate of the first mirror transistor is connected to a second electrode of the first mirror transistor and the light-emitting subloops; and
a second mirror transistor, wherein a gate of the second mirror transistor is connected to the gate of the first mirror transistor, a first electrode of the second mirror transistor is connected to the power supply positive terminal, a second electrode of the second mirror transistor is connected to an anode of the light-emitting device, and a cathode of the light-emitting device is connected to a power supply negative terminal.

7. The display panel as claimed in claim 1, wherein the display panel further comprises a mirror current transmission module for providing a plurality of mirror currents, and the mirror current transmission module is connected to the mirror current receiving module in the each of the plurality of pixel circuit.

8. The display panel as claimed in claim 7, wherein the mirror current transmission module comprises:
a current source, wherein one terminal of the current source is connected to a power supply positive terminal; and
a third mirror transistor, wherein a first electrode of the third mirror transistor is connected to another terminal of the current source and a gate of the third mirror transistor to provide the plurality of mirror currents, and a second electrode of the third mirror transistor is connected to a power supply negative terminal.

9. The display panel as claimed in claim 7, wherein the mirror current transmission module comprises:
   a current source, wherein one terminal of the current source is connected to a power supply positive terminal; and
   a third mirror transistor, wherein a first electrode of the third mirror transistor is connected to another terminal of the current source and a gate of the third mirror transistor, and a second electrode of the third mirror transistor is connected to a power supply negative terminal;
   a fourth mirror transistor, wherein a gate of the fourth mirror transistor is connected to the gate of the third mirror transistor, and a first electrode of the fourth mirror transistor is connected to the power supply negative terminal; and
   a fifth mirror transistor, wherein a first electrode of the fifth mirror transistor is connected to the power supply positive terminal, and a second electrode of the fifth mirror transistor is connected to a second electrode of the fourth mirror transistor and a gate of the fifth mirror transistor to provide the plurality of mirror currents.

10. The display panel as claimed in claim 9, wherein a column of the pixel circuits with a same display color are connected to one of the plurality of mirror currents, and columns of the pixel circuits with different display colors are connected to different ones of the plurality of mirror currents.

11. The display panel as claimed in claim 1, wherein one frame of the each of the plurality of pixel circuits comprises an analog driving subframe and a plurality of digital driving subframes, and duration of the analog driving subframe is same as duration of each of the plurality of digital driving subframes,
   wherein the analog driving subframe is configured to adjust a light-emitting current flowing through the light-emitting module, and
   the plurality of digital driving subframes are configured to adjust a light-emitting time of the light-emitting module.

12. The display panel as claimed in claim 11, wherein the one frame of the each of the plurality of pixel circuits further comprises at least one black frame insertion driving subframe, and duration of each of the at least one black frame insertion driving subframe is same as the duration of the analog driving subframe.

13. The display panel as claimed in claim 11, wherein:
   in one frame, the analog driving subframe is located before the plurality of digital driving subframes;
   the N digital driving units comprise four digital driving units, and each of the four digital driving unit comprises a switching transistor and a register; and
   in the analog driving subframe, the register is connected to a bit value of a data signal, to control the switching transistor to be in an on state or an off state.

14. The display panel as claimed in claim 13, wherein in the plurality of digital driving subframes, the register of each of the four digital driving unit is connected to a same bit value of one data signal, to control the switching transistor of each of the four digital driving unit to be in an on state or an off state.

15. A display device, wherein the display device comprises a terminal main body and a display panel disposed on the terminal main body, wherein the display panel comprises a plurality of pixel circuits, and each of the plurality of the pixel circuits comprises: a mirror current receiving module, wherein the mirror current receiving module comprises N mirror current receiving units, a control terminal of each of the N mirror current receiving units is connected to one mirror current, and the N mirror current receiving units are respectively connected in series to light-emitting subloops, N being an integer greater than or equal to 2; a digital driving module, wherein the digital driving module comprises N digital driving units, and the N digital driving units are respectively connected in series to the light-emitting subloops; a light-emitting module, wherein the light-emitting module is connected to a light-emitting loop formed by the light-emitting subloops; and wherein each of the N digital driving units comprises: a register and the register comprises: a phase inverter, wherein an input terminal of the phase inverter is connected to the data line; a first storage transistor, wherein a first electrode of the first storage transistor is connected to a power supply positive terminal; a second storage transistor, wherein a first electrode of the second storage transistor is connected to a second electrode of the first storage transistor and the gate of the switching transistor, a second electrode of the second storage transistor is connected to a power supply negative terminal, and a gate of the second storage transistor is connected to a gate of the first storage transistor; a third storage transistor, wherein a first electrode of the third storage transistor is connected to the power supply positive terminal, a second electrode of the third storage transistor is connected to the gate of the first storage transistor, and a gate of the third storage transistor is connected to the second electrode of the first storage transistor; a fourth storage transistor, wherein a first electrode of the fourth storage transistor is connected to the second electrode of the third storage transistor, a second electrode of the fourth storage transistor is connected to the power supply negative terminal, and a gate of the fourth storage transistor is connected to the gate of the third storage transistor; a fifth storage transistor, wherein a first electrode of the fifth storage transistor is connected to the data line, a second electrode of the fifth storage transistor is connected to the gate of the second storage transistor, and a gate of the fifth storage transistor is connected to the scan line; and a sixth storage transistor, wherein a first electrode of the sixth storage transistor is connected to an output terminal of the phase inverter, a second electrode of the sixth storage transistor is connected to the gate of the third storage transistor, and a gate of the sixth storage transistor is connected to the gate of the fifth storage transistor.

16. The display device as claimed in claim 15, wherein the mirror current receiving unit comprises a plurality of receiving transistors, a gate of each of the plurality of receiving transistor is connected to the one mirror current, and the plurality of receiving transistors are respectively connected in series to the light-emitting subloops,
   wherein the plurality of receiving transistors have different channel width-to-length ratios.

17. The display device as claimed in claim 15, each of the N digital driving units comprises: a switching transistor connected in series to one of the light-emitting subloops; and the register connected to a gate of the switching transistor, a scan line, and a data line.

18. The display device as claimed in claim 17, wherein registers in the N digital driving units are connected to one scan line and are respectively connected to different data lines.

* * * * *